(12) United States Patent
Bianchi (10) Patent No.: US 10,151,822 B2
(45) Date of Patent: Dec. 11, 2018

(54) TESTER

(71) Applicant: Advantest Corporation, Tokyo (JP)

(72) Inventor: Giovanni Bianchi, Ehningen (DE)

(73) Assignee: Advantest Corporation, Tokyo (JP)

( * ) Notice: Subject to any disclaimer, the term of this patent is extended or adjusted under 35 U.S.C. 154(b) by 253 days.

(21) Appl. No.: 15/151,250

(22) Filed: May 10, 2016

(65) Prior Publication Data

US 2016/0252602 A1    Sep. 1, 2016

Related U.S. Application Data

(63) Continuation of application No. PCT/EP2013/073994, filed on Nov. 15, 2013.

(51) Int. Cl.
*G01R 35/00* (2006.01)
*G01R 31/28* (2006.01)
*G01R 27/28* (2006.01)

(52) U.S. Cl.
CPC ........... *G01R 35/005* (2013.01); *G01R 27/28* (2013.01); *G01R 31/2822* (2013.01)

(58) Field of Classification Search
CPC ....................................................... G01R 27/28
See application file for complete search history.

(56) References Cited

U.S. PATENT DOCUMENTS 6,327,545 B1   12/2001  Browen et al.
6,397,160 B1   5/2002   Craig et al.
6,795,496 B1   9/2004   Soma et al.
(Continued)

FOREIGN PATENT DOCUMENTS

EP   0626588   11/1994
EP   0984291   3/2000
(Continued)

OTHER PUBLICATIONS

Quintanel, S., et al., "On-Wafer Multi-Port Circuits Characterization Technique with a Two-Port VNA," IEEE 81st ARFTG Microwave Measurement Conference, Seattle, WA, Jun. 7, 2013, pp. 1-4.
(Continued)

*Primary Examiner* — Clayton E Laballe
*Assistant Examiner* — Jas Sanghera (57) ABSTRACT

A tester including a source and measuring device and a TX port connected to the source and measuring device is provided. The tester is configured to determine a source reflection coefficient using an extension circuit. The extension circuit includes a TX port connectable to the source and measuring device, a termination switch and a calibration device providing one or more terminations, wherein each of the terminations is individually connectable to the TX port by the termination switch, wherein one of the terminations is a power sensor. The source and measuring device is configured to measure one or more reflection coefficients at the TX port for the one or more terminations provided by the calibration device including the reflection coefficient for the power sensor. The tester is configured to determine the source reflection coefficient based on the one or more measured reflection coefficients including the measured reflection coefficient for the power sensor.

26 Claims, 8 Drawing Sheets

(56) References Cited

U.S. PATENT DOCUMENTS

| | | |
|---|---|---|
| 7,148,702 B2 | 12/2006 | Wong et al. |
| 7,235,982 B1 | 6/2007 | Shoulders |
| 7,248,033 B2 | 7/2007 | Anderson et al. |
| 7,256,585 B1 | 8/2007 | Shoulders |
| 2004/0004466 A1 | 1/2004 | Miyanaga et al. |
| 2005/0050546 A1 | 3/2005 | Remany et al. |
| 2005/0068068 A1 | 3/2005 | Hall |
| 2005/0234662 A1 | 10/2005 | Niedzwiecki et al. |
| 2009/0092177 A1 | 4/2009 | Dvorak et al. |
| 2009/0129129 A1 | 5/2009 | Udagawa |
| 2009/0184721 A1* | 7/2009 | Albert-Lebrun ....... G01R 27/32 324/601 |
| 2009/0272634 A1 | 11/2009 | Ehlers et al. |
| 2010/0225301 A1 | 9/2010 | Nakayama et al. |
| 2010/0228515 A1 | 9/2010 | Srinivasan et al. |
| 2010/0309952 A1 | 12/2010 | Asami |
| 2010/0312506 A1 | 12/2010 | Taylor |
| 2011/0227767 A1 | 9/2011 | O'Brien |
| 2012/0049655 A1 | 3/2012 | Leyendecker et al. |
| 2012/0221279 A1 | 8/2012 | Zhang |
| 2013/0006567 A1 | 1/2013 | Horn |
| 2013/0229068 A1 | 9/2013 | Sanders, III et al. |
| 2013/0234723 A1 | 9/2013 | Behrens et al. |

FOREIGN PATENT DOCUMENTS

| | | |
|---|---|---|
| EP | 1298778 | 4/2003 |
| JP | H11038087 | 2/1999 |
| JP | 2000009792 | 1/2000 |
| WO | 99/21025 | 4/1999 |
| WO | 2012/084028 | 6/2012 |
| WO | 2014/135194 | 9/2014 |

OTHER PUBLICATIONS

Lenk, F., et al., "A New Multiport Measurement-Method Using a Two-Port Network Analyzer," IEEE MTT-S International Microwave Symposium, Jun. 12-17, 2005, pp. 1663-1666.

Kam, D.G., et al., "Multipart Measurement Method Using a Two-Port Network Analyzer With Remaining Ports Unterminated," IEEE Microwave and Wireless Components Letters, vol. 17, No. 9, Sep. 2007, pp. 694-696.

Chen, C.-J., et al., "An Error Analysis of the Scattering Matrix Renormalization Transform," IEEE Transactions on Microwave Theory and Techniques, vol. 57, No. 4, Apr. 2009, pp. 863-868.

Rolfes, I., et al., "Multipart Method for the Measurement of the Scattering Parameters of N-Ports," IEEE Transactions on Microwave Theory and Techniques, vol. 53, No. 6, Jun. 2005, pp. 1990-1996.

Sismanoglou, P., et al, "Input Test Data Compression Based on the Reuse of Parts of Dictionary Entries: Static and Dynamic Approaches," IEEE Transactions on Computer-Aided Design of Integrated Circuits and Systems, vol. 32, No. 11, Nov. 2013, pp. 1762-1775.

White, H.E., "Printed English Compression by Dictionary Encoding," Proceedings of the IEEE, vol. 55, No. 3, Mar. 1967, pp. 390-396.

Ting, Shang-Kee et al., "An Algorithm to Compensate the Effects of Spurious PLL Tones in Spectrum Sensing Architectures", IEEE Transactions on Circuits and Systems, I: Regular Papers, vol. 59, No. 5, May 1, 2012, pp. 1093-1106.

Jamal, Shafiq M. et al., "Calibration of Sample-Time Error in a Two-Channel Time-Interleaved Analog-to-Digital Converter," IEEE Transactions on Circuits and Systems, I: Regular Papers, vol. 51, No. 1, Jan. 1, 2004, pp. 130-139.

Marple, S. Lawrence Jr., "Computing the Discrete-Time 'Analytic' Signal via FFT," IEEE Transactions on Signal Processing, vol. 47, No. 9, Sep. 1, 1999, pp. 2600-2603.

Liu, Lei, "Finite Automata for Evaluating Testbed Resource Contention," IEEE, Wireless Telecommunications Symposium WTS 2007, Piscataway, NJ, Apr. 26, 2007, pp. 1-6.

Nieuwoudt, I et al., "Algorithms for a Shared Resource Scheduling Problem in Which Some Level of Conflict is Tolerable," Journal of Scheduling, Kluwer Academic Publishers, vol. 15, No. 6, Sep. 29, 2012, pp. 681-702.

\* cited by examiner

Connecting a TX port of an extension circuit 120 to the source and measuring device 102, wherein the extension circuit 120 comprises a termination switch 133 and a calibration device 122 providing one or more terminations, wherein each of the terminations is individually connectable to the TX port by the termination switch 133, wherein one of the terminations is a power sensor 124, which is configured to measure the power $P_{TX}$ of the source and measuring device 102 at the TX port ——202

Measuring one or more reflection coefficients $\Gamma_{load\_m}$, $\Gamma_{short\_m}$, $\Gamma_{open\_m}$ at the TX port for the one or more terminations provided by the calibration device 122 including the reflection coefficient $\Gamma_{load\_m}$ for the power sensor 124 ——204

Determining the source reflection coefficient $\Gamma_{source}$ based on the one or more measured reflection coefficients $\Gamma_{load\_m}$, $\Gamma_{short\_m}$, $\Gamma_{open\_m}$ including the measured reflection coefficient $\Gamma_{load\_m}$ for the power sensor 124 ——206

FIG 6

TESTER

CROSS-REFERENCE TO RELATED APPLICATIONS

This application is a continuation of copending International Application No. PCT/EP2013/073994, filed Nov. 15, 2013, which is incorporated herein by reference in its entirety.

BACKGROUND OF THE INVENTION

Embodiments of the present invention relate to a tester. Further embodiments relate to a system comprising a tester and an extension circuit. Further embodiments relate to a method for determining the source reflection coefficient of a source and measuring device of a tester. Some embodiments relate to a vector based in-system power calibration.

With the need of many RF (RF=radio frequency) ports in ATE (ATE=automatic test equipment) systems it becomes more and more challenging to keep the overall calibration time low or even reduce it. To get additional RF ports more switches are used in a fan out structure which degrades RF performance.

Figure 1:
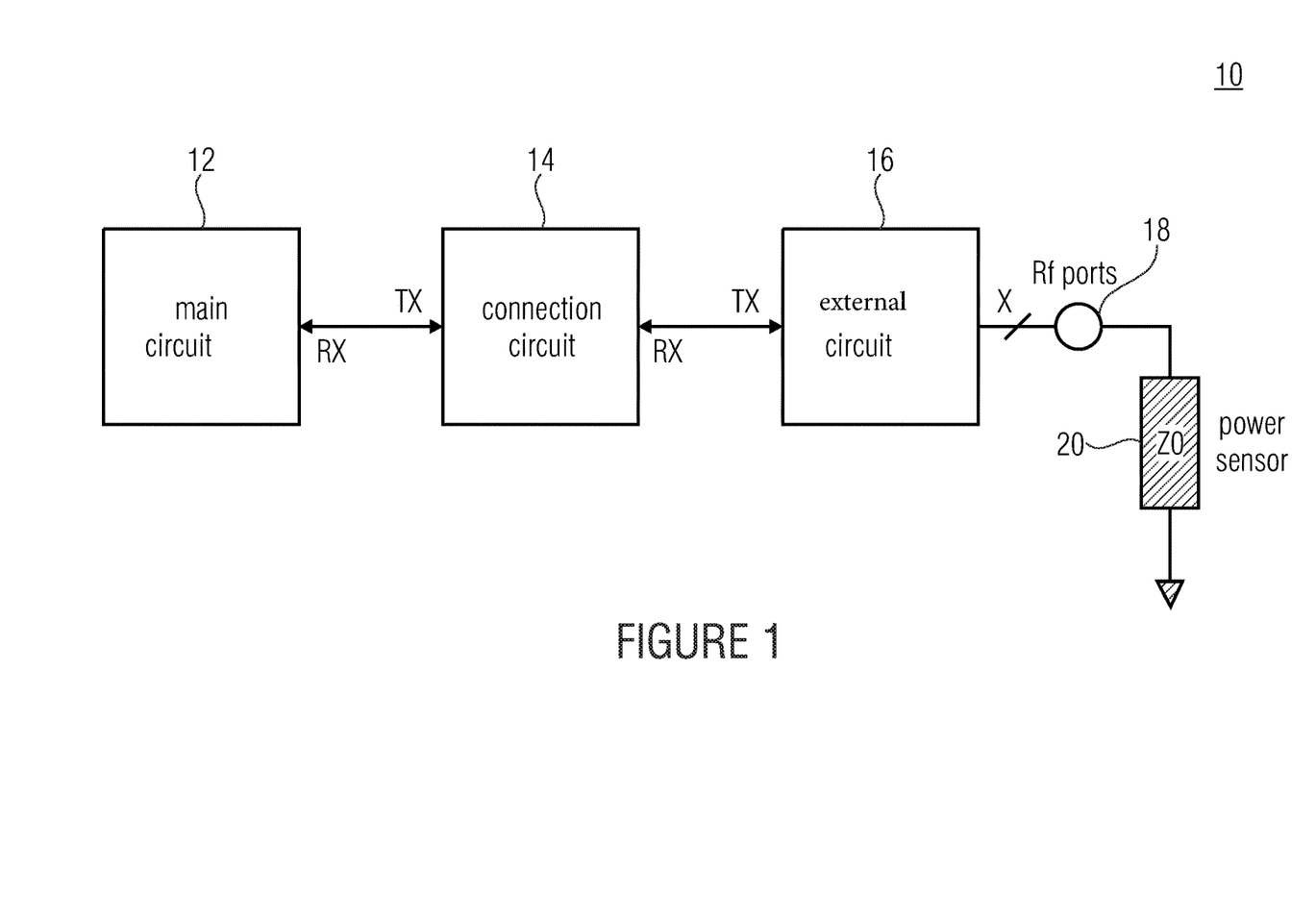
FIG. 1 shows a block diagram of a conventional power calibration setup.

FIG. 1 shows a block diagram of a conventional power calibration setup 10. The conventional power calibration setup 10 consists of a main circuit 12, a connection circuit 14, an external circuit 16, RF ports 18 and a power sensor 20.

As indicated in FIG. 1, one conventional method of a power calibration at each port 18 is the measuring of the absolute power at each port 18 over frequency when it is terminated with the reference impedance of the system (Z0). The technique can achieve very accurate results but costs time and is only appropriate with small port counts.

As disclosed in the WO 2012/084028, another approach is to use the external circuit for the fan out structure and an integrated power sensor that measures the RF input power at the TX port and transforms it with the known path loss to all other ports. This concept reduces calibration time by factor X.

But this is only valid for a 50Ω system, which means a 50Ω load and a 50Ω source connected with a 50Ω connection circuit. In reality, the output match is not 50Ω, it is a complex impedance. In addition, the input match of the power sensor and the match of every other through path is not 50Ω due to series resistance of RF switches and signal routing with VIAs and connectors, just like the connection circuit is not a 50Ω system too. This leaves an unknown mismatch error (ripple) that directly impacts power accuracy, as will become clear from FIGS. 2a and 2b.

Figure 2A:
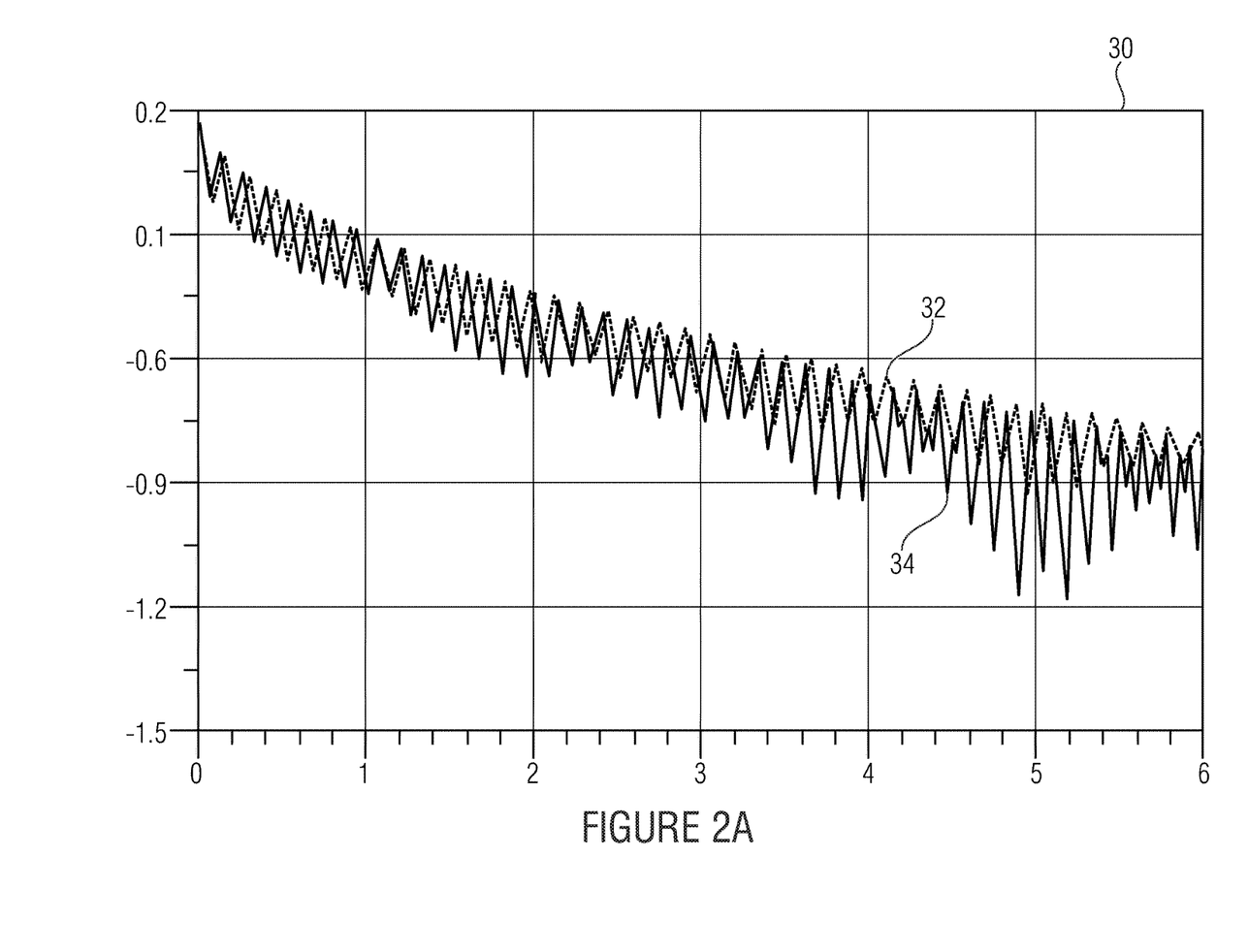
FIG. 2a shows in a diagram the insertion loss of a non 50Ω connection circuit with a 50Ω source and a 50Ω load, and the insertion loss of the non 50Ω connection circuit with a non 50Ω source and a non 50Ω load.

FIG. 2a shows in a diagram 30 the insertion loss of a non 50Ω connection circuit with a 50Ω source and a 50Ω load (first curve 32), and the insertion loss of the non 50Ω connection circuit with a non 50Ω source and a non 50Ω load (second curve 34). Thereby, the ordinate denotes the insertion loss in dB, where the abscissa denotes the frequency in GHz.

Figure 2B:
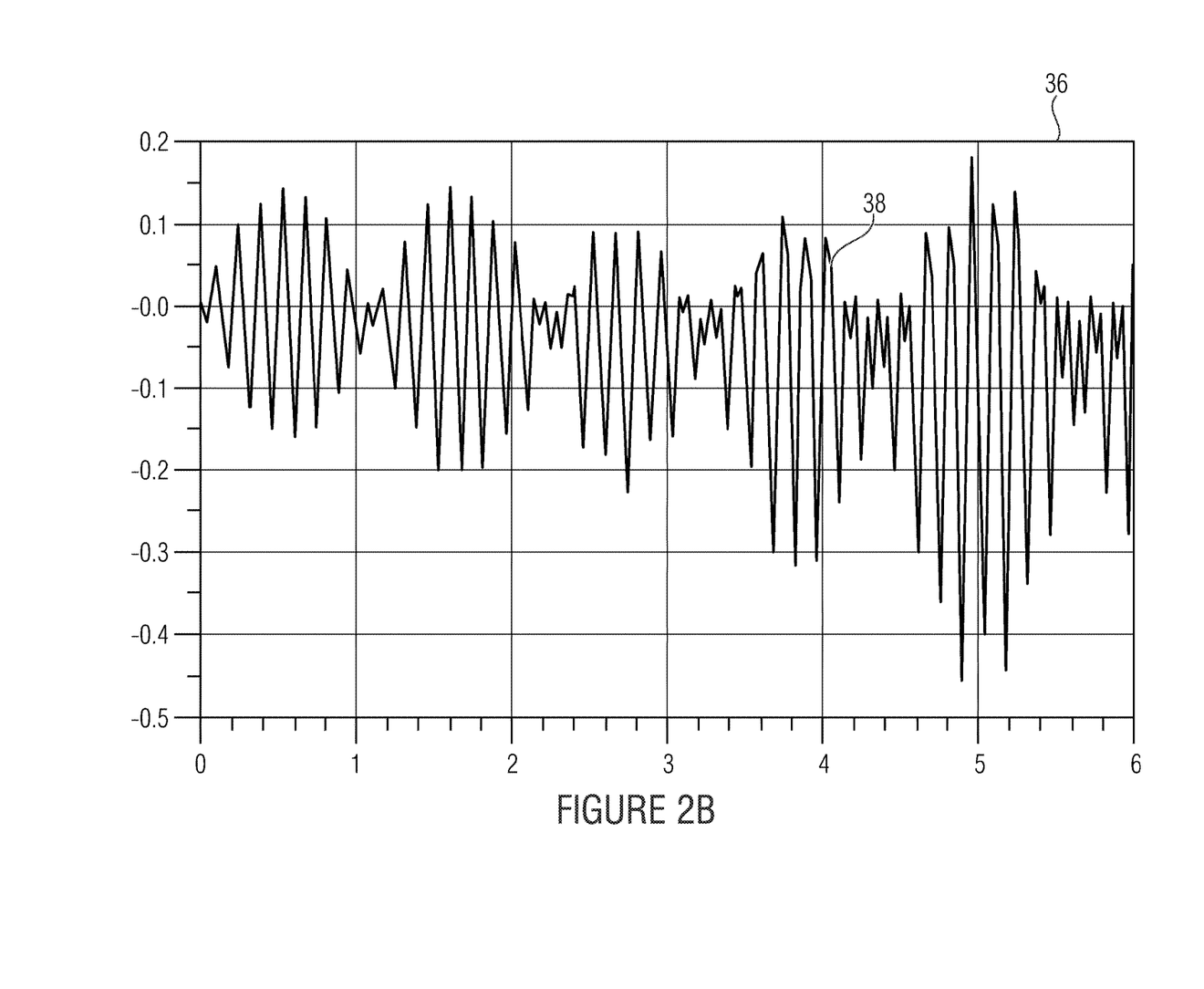
FIG. 2b shows in a diagram the resulting mismatch error of the non 50Ω connection circuit with the non 50Ω source and the non 50Ω load.

FIG. 2b shows in a diagram 36 the resulting mismatch error of the non 50Ω connection circuit with the non 50Ω source and the non 50Ω load (third curve 38). Thereby the ordinate denotes the mismatch error in dB, where the abscissa denotes the frequency in GHz.

SUMMARY

According to an embodiment, a tester may have: a source and measuring device, wherein the tester is configured to determine a source reflection coefficient using an extension circuit, wherein the extension circuit includes a TX port connectable to the source and measuring device, a termination switch and a calibration device providing one or more terminations, wherein each of the terminations is individually connectable to the TX port by the termination switch, wherein one of the terminations is a power sensor, which is configured to measure the power of the source and measuring device at the TX port, wherein the source and measuring device is configured to measure one or more reflection coefficients at the TX port for the one or more terminations provided by the calibration device including the reflection coefficient for the power sensor, and wherein the tester is configured to determine the source reflection coefficient based on the one or more measured reflection coefficients including the measured reflection coefficient for the power sensor.

According to another embodiment, a system may have: an inventive tester; and an extension circuit including a TX port connected to the tester, a termination switch and a calibration device providing one or more terminations, wherein each of the terminations is individually connectable to the TX port by the termination switch, wherein one of the terminations is a power sensor, which is configured to measure the power of the source and measuring device at the TX port.

According to another embodiment, a method for determining the source reflection coefficient of a source and measuring device of a tester may have the steps of: connecting a TX port of an extension circuit to the source and measuring device, wherein the extension circuit includes a termination switch and a calibration device providing one or more terminations, wherein each of the terminations is individually connectable to the TX port by the termination switch, wherein one of the terminations is a power sensor, which is configured to measure the power ($P_{TX}$) of the source and measuring device at the TX port; measuring one or more reflection coefficients at the TX port for the one or more terminations provided by the calibration device including the reflection coefficient for the power sensor; and determining the source reflection coefficient based on the one or more measured reflection coefficients including the measured reflection coefficient for the power sensor.

A tester comprising a source and measuring device and a TX port connected to the source and measuring device is provided. The tester is configured to determine a source reflection coefficient using an extension circuit. The extension circuit comprises a TX port connectable to the source and measuring device, a termination switch and a calibration device providing one or more terminations, wherein each of the terminations is individually connectable to the TX port by the termination switch, wherein one of the terminations is a power sensor, which is configured to measure the power of the source and measuring device at the TX port. The source and measuring device is configured to measure one or more reflection coefficients at the TX port for the one or more terminations provided by the calibration device including the reflection coefficient for the power sensor. The tester is configured to determine the source reflection coefficient based on the one or more measured reflection coefficients including the measured reflection coefficient for the power sensor.

According to the concept of the present invention, the source power of the source and measuring device of the tester can be calibrated (e.g., after connecting the tester to an extension circuit, or each time the tester is connected to a TX port of an extension circuit via the) by determining (in a first step) the source reflection coefficient using the extension circuit which may provide for this purpose one or more terminations, wherein one of the terminations is a power sensor, and by using (in a second step) the determined source reflection coefficient and the power sensor of the extension circuit.

A system comprising a tester and an extension circuit is provided. The tester comprises a source and measuring device. The tester is configured to determine a source reflection coefficient using an extension circuit. The extension circuit comprises a TX port connectable to the source and measuring device, a termination switch and a calibration device providing one or more terminations, wherein each of the terminations is individually connectable to the TX port by the termination switch. One of the terminations is a power sensor, which is configured to measure the power of the source and measuring device at the TX port.

A method for determining the source reflection coefficient of a source and measuring device of a tester is provided. The method comprises connecting a TX port of an extension circuit to the source and measuring device, wherein the extension circuit comprises a termination switch and a calibration device providing one or more terminations, wherein each of the terminations is individually connectable to the TX port by the termination switch, wherein one of the terminations is a power sensor, which is configured to measure the power of the source and measuring device at the TX port. Further, the method comprises measuring one or more reflection coefficients at the TX port for the one or more terminations provided by the calibration device including the reflection coefficient for the power sensor. Moreover, the method comprises determining the source reflection coefficient based on the one or more measured reflection coefficients including the measured reflection coefficient for the power sensor

BRIEF DESCRIPTION OF THE DRAWINGS

Embodiments of the present invention will be detailed subsequently referring to the appended drawings, in which.

DETAILED DESCRIPTION OF THE INVENTION

Equal or equivalent elements or elements with equal or equivalent functionality are denoted in the following description by equal or equivalent reference numerals.

In the following description, a plurality of details are set forth to provide a more thorough explanation of embodiments of the present invention. However, it will be apparent to those skilled in the art that embodiments of the present invention may be practiced without these specific details. In other instances, well-known structures and devices are shown in block diagram form rather than in detail in order to avoid obscuring embodiments of the present invention. In addition, features of different embodiments described hereinafter may be combined with each other, unless specifically noted otherwise.

Figure 3:
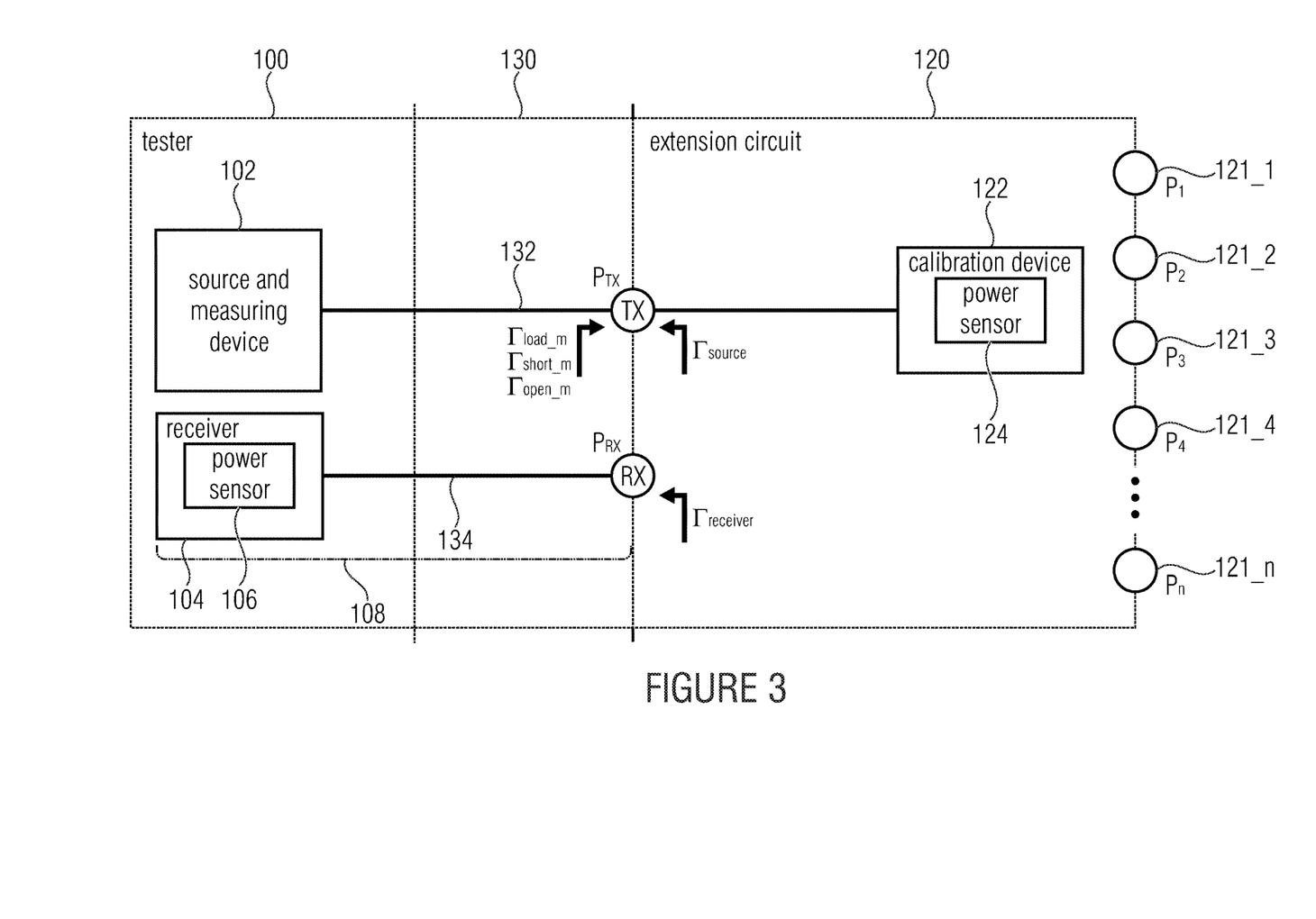
FIG. 3 shows a block diagram of a tester according to an embodiment of the present invention.

FIG. 3 shows a block diagram of a system according to an embodiment of the present invention. The system includes a tester 100 and an extension circuit 120. The tester 100 comprises a source and measuring device 102, whereas the extension circuit comprises a TX (transmission) port connectable to the source and measuring device 102. The tester 100 is configured to determine a source reflection coefficient $\Gamma_{source}$ using the extension circuit 120. The extension circuit 120 comprises a calibration device 122 having a power sensor 124, which is configured to measure the power $P_{TX}$ of the source and measuring device 102 at the TX port. The calibration device 122 is configured to provide a plurality of different terminations 124, 134, 135 at the TX port as depicted in FIG. 4A. The tester 100 may be configured to calibrate a source power of the source and measuring device 102 using the determined source reflection coefficient $\Gamma_{source}$ and the power sensor 124.

According to some embodiments, the source power $P_{source}$ of the source and measuring device 102 of the tester 100 can be calibrated (e.g., after connecting the tester 100 to an extension circuit 120, or each time the tester 100 is connected to the TX port of the extension circuit 120 by determining (in a first step) the source reflection coefficient using the extension circuit 120 which may provide for this purpose one or more terminations 124, 134, 135, wherein one of the terminations 124, 134, 135 is a power sensor 124, and by using (in a second step) the determined source reflection coefficient and a power sensor 124 of the extension circuit 120.

As shown in FIG. 4A, the calibration device 122 is connected to the TX port in order to provide one or more terminations 124, 134, 135 at the TX port.

Moreover, the tester 100 can be configured to derive a power value $P_1$ to $P_n$ at a RF port $121_1$ to $121_n$ of the extension circuit 120 using known parameters of the extension circuit 120. The RF port $121_1$ to $121_n$ can be used to connect the extension circuit 120 to a DUT (DUT=device under test).

Note, that the extension circuit 120 can comprise up to n RF ports $121_1$ to $121_n$, wherein n is a natural number greater than or equal to 1. (n≥1).

For example, the extension circuit 120 can comprise 1, 2, 3, 5, 10, 20, 30, 50, 100 or even more RF ports $121_1$ to $121_n$.

In some embodiments, the tester 100 can further comprise a receiver 104 and a RX (receiving) port connected to the receiver 104.

Observe that the tester 100 can comprise a connection circuit 130 comprising flexible cables for connecting the tester 100 to the extension circuit 120.

For example, the source and measuring device 102 can be connected to the TX port via a flexible cable 132 of the connection circuit 130. Similarly, the receiver 104 can be connected to the RX port via a flexible cable 134 of the connection circuit 130.

Thereby, an arrangement, alignment or course of the flexible cables 132 and 134 may vary each time the tester 100 is connected to an extension circuit 120. Thus, a calibration of the source power $P_{source}$ of the source and measuring device 102 may be necessitated each time the tester 100 is connected to an extension circuit 120. Similarly, the receiver 104 may also be calibrated each time the tester 100 is connected to an extension circuit 120.

FIG. 4a shows a block diagram of a calibration device 122 of the system, according to an embodiment of the present invention. The calibration device 122 comprises a termination switch 133 having a common contact, which is connectable to the TX port via the switch 126. The common contact may be connected either to a short termination 134, to an open termination 135 or to the power sensor 124 which is also used as a load termination 124.

As already mentioned, the calibration device 122 of the extension circuit 120 can be configured to provide one or more terminations 124, 134, 135 at the TX port. The one or more terminations 124, 134, 135 include the power sensor 124, which is configured to measure the power $P_{TX}$ of the source and measuring device 102 at the TX port of the calibration device. By this, the power sensor 124 gets two functions: The first function is to measure the power $P_{TX}$ of the source and measuring device 102 at the TX port of the extension circuit 120, which is useful for calibrating a source power $P_{source}$ of the source and measuring device 102, whereas the second function is to act as a load termination 124 for which a reflection coefficient $\Gamma_{load\_m}$ is measured at the TX port in order to determine the source reflection coefficient $\Gamma_{source}$ of the source and measuring device 102. In other words, the power sensor 124 of the calibration device 122 may not only be used as a power sensor 124 but also as the load termination 124 for which a reflection coefficient $\Gamma_{load\_m}$ is measured.

Basically, the power sensor 124 can be used as load termination 124, providing that the power sensor 124 itself presents a good impedance matching on its RF input port. However, such requirement is not an additional one. The power sensor 124 has to present a good impedance matching on its RF input port anyway in order to ensure accurate power measurements. As a result, there is no separate load termination needed.

The advantages of using the power sensor 124 as a load termination 124 for which a reflection coefficient $\Gamma_{load\_m}$ is measured are a simpler structure and the less component count.

In some embodiments of the invention one of the terminations 124, 134, 135 is an open termination 135, wherein the source and measuring device 102 is configured to measure additionally the reflection coefficient $\Gamma_{open\_m}$ at the TX port for the open termination 135 provided by the calibration device 122, and the tester 100 is configured to determine the source reflection coefficient $\Gamma_{source}$ additionally based on the measured reflection coefficient $\Gamma_{open\_m}$ for the open termination 135.

According to some embodiments of the invention one of the terminations 124, 134, 135 is a short termination 134, wherein the source and measuring device 102 is configured to measure additionally the reflection coefficient $\Gamma_{short\_m}$ at the TX port for the short termination 134 provided by the calibration device 122, and wherein the tester 100 is configured to determine the source reflection coefficient $\Gamma_{source}$ additionally based on the measured reflection coefficient $\Gamma_{short\_m}$ for the short termination 134.

According to some embodiments of the invention the terminations 124, 134, 135 exclusively consist of the power sensor 124, an open termination 135 and a short termination 134, wherein the source and measuring device 102 is configured to measure the reflection coefficients $\Gamma_{load\_m}$, $\Gamma_{short\_m}$, $\Gamma_{open\_m}$ at the TX port for the power sensor 124, for the open termination 135 and for the short termination 134 provided by the calibration device 122, and wherein the tester 100 is configured to determine the source reflection coefficient ($\Gamma_{source}$) based on the measured reflection coefficients $\Gamma_{load\_m}$, $\Gamma_{short\_m}$, $\Gamma_{open\_m}$ for the power sensor 124, for the open termination 135 and for the short termination 134.

In some embodiments of the invention, the termination switch 133 is a SP3T switch 133. A SP3T switch is also known as a single pole, triple throw switch. Its a simple change over switch having a common contact which can be connected to three other contacts.

Note, that in solutions, wherein the power sensor 124 would not be used as a load termination 124 for which a reflection coefficient is measured, a SP4T switch would be needed in order to connect either an open termination 135, a short termination 134, a load termination and the power sensor 124 to the TX port.

The reduced number of ways offers the opportunity to increase RF performances. As a trend, SP3T' switches present better compromise between insertion-loss, impedance matching, and isolation than SP4T switches.

Figure 4:
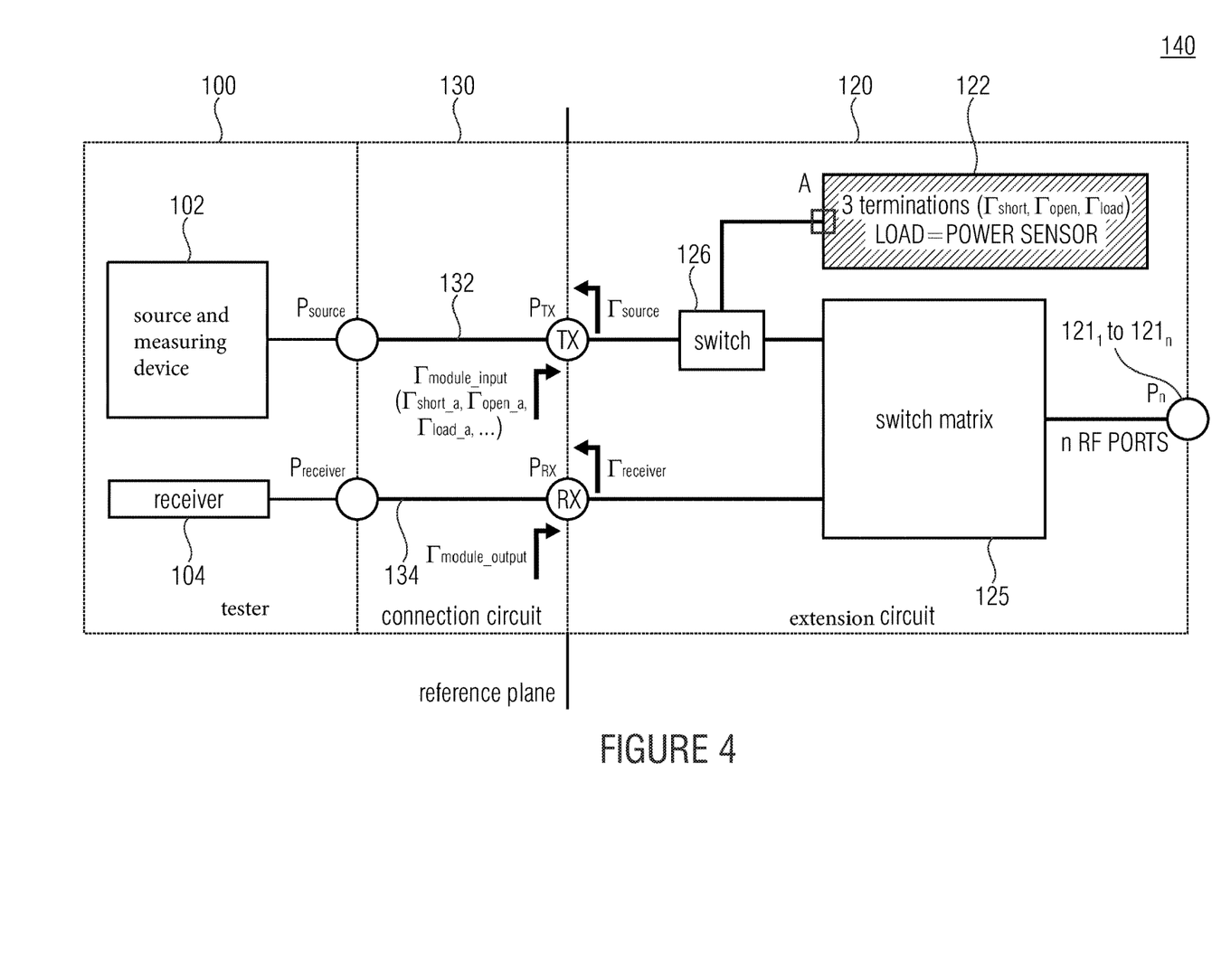
FIG. 4 shows a block diagram of a system comprising a tester and an extension circuit, according to an embodiment of the present invention.
Figure 4A:
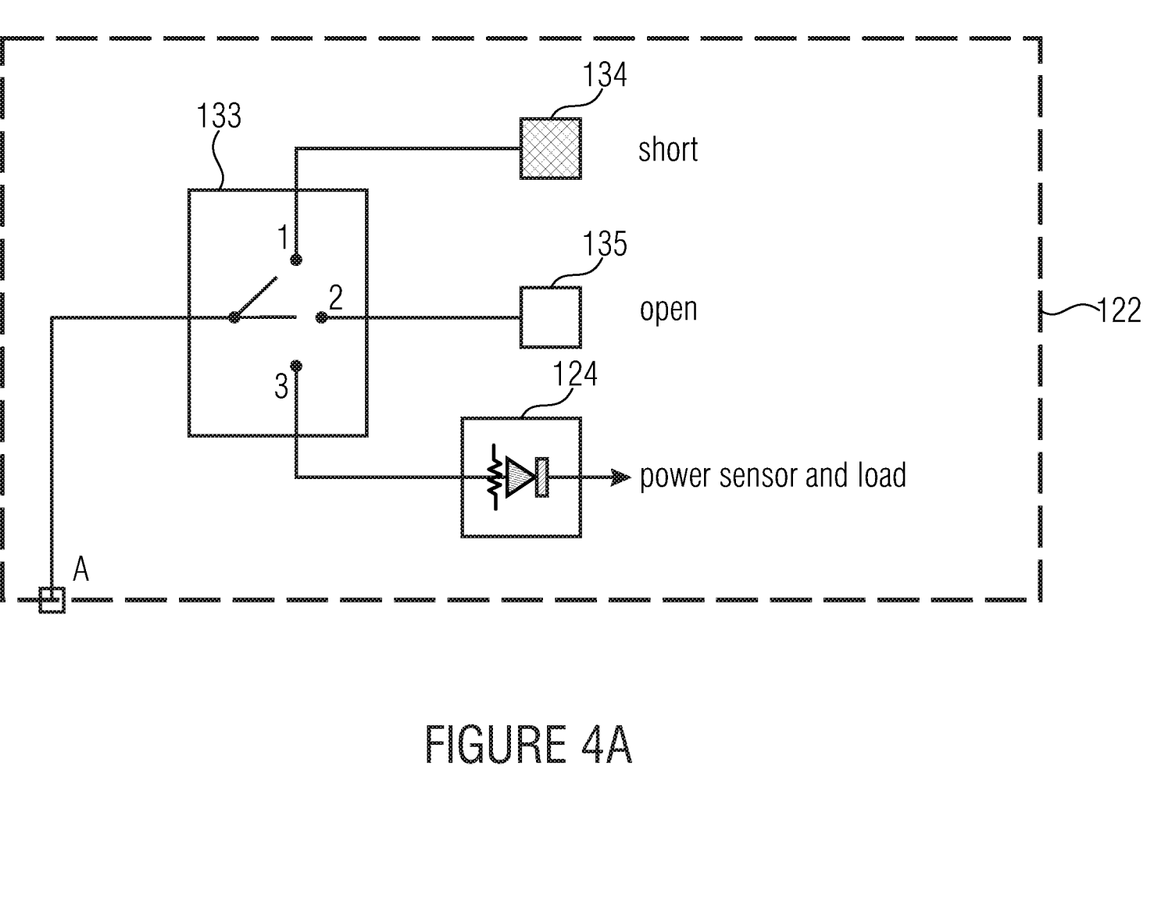
FIG. 4a shows a block diagram of a calibration device of a system, according to an embodiment of the present invention.

The known parameters of the extension circuit 120 shown FIG. 4 may include reflection S parameters of the extension circuit 120 and/or transmission S parameters of the extension circuit 120.

For example, the reflection S parameters of the extension circuit 120 may include an actual reflection coefficient $\Gamma_{load\_a}$ of the load in the extension circuit 120 referenced to the port TX.

Further, the reflection S parameters of the extension circuit 120 may include an actual reflection coefficient $\Gamma_{short\_a}$ of the short in the extension circuit 120 referenced to the port TX.

Further, the reflection S parameters of the extension circuit 120 may include an actual reflection coefficient $\Gamma_{open\_a}$ of the open in the extension circuit 120 referenced to the port TX.

Further, the reflection S parameters of the extension circuit 120 may include an actual reflection coefficient $S_{TXTX}$ of the TX port in the extension circuit 120 referenced to the port TX, when the path in the extension circuit 120 is set from the port TX to the port RX.

Further, the reflection S parameters of the extension circuit 120 may include an actual reflection coefficient $S_{RXRX}$ of the RX port in the extension circuit 120 referenced to the port RX, when the path in the extension circuit 120 is set from the port TX to the port RX.

For example, the transmission S parameters of the extension circuit 120 may include an actual transmission coefficient $S_{TXRX}$ of the path from the port RX to the port TX of the extension circuit 120.

Further, the transmission S parameters of the extension circuit 120 may include an actual transmission coefficient $S_{RXTX}$ of the path from the port TX to the port RX of the extension circuit 120.

Note that the reflection S parameters ($\Gamma_{load\_a}$, $\Gamma_{short\_a}$, $\Gamma_{open\_a}$, $S_{TXTX}$, $S_{RXRX}$) and the transmission S parameters ($S_{TXRX}$, $S_{RXTX}$) of the extension circuit 120 may be obtained with a network analyzer before connecting the extension circuit 120 to the tester 100 (in order obtain the known parameters of the extension circuit 120).

The source and measuring device 102 of the tester 100 can be configured to measure a plurality of reflection coefficients at the TX port for the plurality of different terminations provided by the calibration device 122 at the TX port. Thereby, the tester 100 can be configured to determine the source reflection coefficient $\Gamma_{source}$ based on the measured reflection coefficients.

For example, the tester 100 can be configured to control the calibration device 122 to provide the load termination 124 at the TX port, and to measure the reflection coefficient $\Gamma_{load\_m}$ of the load termination 124 in the extension circuit 120 referenced to the port TX with the source and measuring device 102, in order to obtain a measured reflection coefficient $\Gamma_{load\_m}$ of the load termination 124.

Further, the tester 100 can be configured to control the calibration device 122 to provide the short termination 134 at the TX port, and to measure the reflection coefficient $\Gamma_{short\_m}$ of the short termination 134 in the extension circuit 120 referenced to the port TX with the source and measuring device 102, in order to obtain a measured reflection coefficient $\Gamma_{short\_m}$ of the short termination 134.

Further, the tester 100 can be configured to control the calibration device 122 to provide the open termination 135 at the TX port, and to measure the reflection coefficient $\Gamma_{open\_m}$ of the open termination 135 in the extension circuit 120 referenced to the port TX with the source and measuring device 102, in order to obtain a measured reflection coefficient $\Gamma_{open\_m}$ of the open termination 135.

As already indicated, the tester 100 can be configured to determine the source reflection coefficient $\Gamma_{source}$ based on the measured reflection coefficients $\Gamma_{load\_m}$, $\Gamma_{short\_m}$, $\Gamma_{open\_m}$. Moreover, the tester 100 can be configured to determine the source reflection coefficient $\Gamma_{source}$ further based on the known reflection coefficients $\Gamma_{load\_a}$, $\Gamma_{short\_a}$, $\Gamma_{open\_a}$ of the extension circuit 120 at the TX port.

In other words, the tester 100 can be configured to determine the source reflection coefficient $\Gamma_{source}$ based on the measured reflection coefficients $\Gamma_{load\_m}$, $\Gamma_{short\_m}$, $\Gamma_{open\_m}$ and based on the known reflection coefficients $\Gamma_{load\_a}$, $\Gamma_{short\_a}$, $\Gamma_{open\_a}$ of the extension circuit 120 at the TX port.

Finally, the tester 100 can be configured to calibrate the source power $P_{source}$ of the source and measuring device 102 by obtaining a measured source power $P_{TX}$ at the port TX using the power sensor 124 of the extension circuit 120 and determining an actual source power $P'_{source}$ available for a termination of the TX port with a reference impedance using the measured source power $P_{TX}$ and the source reflection coefficient $\Gamma_{source}$.

Thereby, the tester 100 can be configured to determine a calibration factor calfactor for calibrating the source power $P_{source}$ based on the set source power $P_{source}$ set at the source and measuring device and the actual source power $P'_{source}$.

The above described principle for calibrating the source power $P_{source}$ of the source and measuring device 102 will be explained in further detail making reference to FIG. 4.

Note that the tester 100 may also be configured to calibrate a receiver power $P_{RX}$ of the receiver 104.

The tester 100 can be configured to control the extension circuit 120 to set up a loopback path connecting the TX port and the RX port via the extension circuit 120, and to calibrate the receiver power $P_{RX}$ of the receiver 104 using the calibrated source power $P_{source}$ and a power sensor 106 of the receiver 104.

Thereby, the tester 100 can be configured to determine a reflection coefficient $\Gamma_{RX}$ presented by a receiver path 108 to the extension circuit 120 at the RX port by using a measured reflection coefficient $\Gamma_{RX}$ measured at the port TX with the source and measuring device 102 under the condition that the TX port is connected with the RX port and that the RX port is connected to the receiver path 108, and known parameters of the extension circuit 120, and to calibrate the receiver power $P_{RX}$ further based on the determined reflection coefficient $\Gamma_{RX}$ presented by the receiver path 108 to the extension circuit 120 at the RX port.

Further, the tester 100 can be configured to calibrate the receiver power $P_{RX}$ by calculating a receiver power at the RX port using the determined reflection coefficient $\Gamma_{RX}$ presented by the receiver path 108 to the extension circuit 120 at the RX port and known parameters of the extension circuit.

Finally, the tester 100 can be configured to derive a power input to the extension circuit 120 from a device under test on the basis of a power value measured by the receiver 104 of the tester 100.

For example, a device under test can be connected to at least one of the ports $121_1$ to $121_n$ of the extension circuit 120, wherein the tester 100 can be configured to derive a power $P_1$ to $P_n$ input into the extension circuit 120 via at least one of the ports $121_1$ to $121_n$ on the basis of a power value measured by the receiver 104 of the tester 100.

The above described principle for calibrating the receiver power $P_{RX}$ of the receiver 104 will also be explained in further detail making reference to FIG. 4.

Note that the following description, although referring to a system 140 comprising the tester 100 and the extension circuit 120, is also applicable to the tester 100, e.g., shown in FIG. 3.

FIG. 4 shows a block diagram of a system 140 comprising the tester 100 and the extension circuit 120, according to an embodiment of the present invention.

As shown in FIG. 4, the tester 100 and the extension circuit 120 can be connected via the TX port and the RX port. Moreover, the extension circuit 120 may be connected to a device under test via the RF ports $P_1$ to $P_n$.

In contrast to FIG. 3, the extension circuit 120 (e.g., extension circuit) further comprises a switch matrix 125 connected between the TX port, the RX port and at least one of the RF ports $P_1$ to $P_n$.

In a first state, the extension circuit 120 can be configured to provide a loopback path by connecting the TX port and the RX port. For example, the extension circuit 120 can be controlled (e.g., by the tester 100) to provide the loopback path by connecting the TX port and the RX port via the switch matrix 125.

Figure 5A:
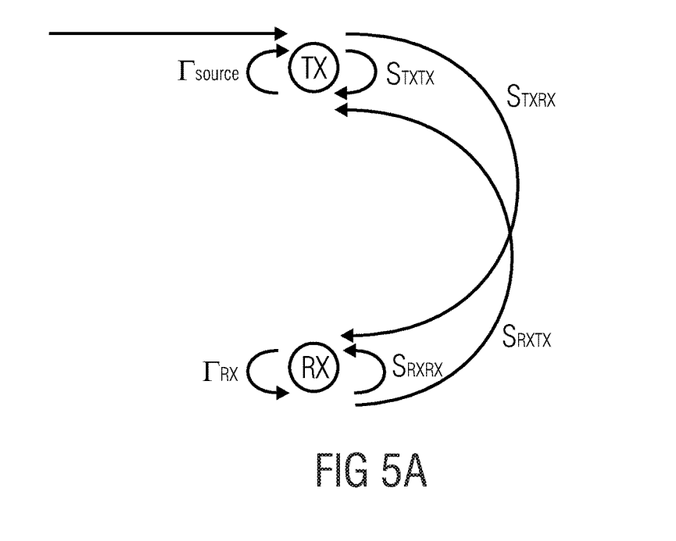
FIG. 5a shows an illustrative view of the reflection coefficients and transmission coefficients which may be effective at the TX port in the first state of the extension circuit.

Note that FIG. 5a shows an illustrative view of the reflection coefficients $\Gamma_{source}$, $\Gamma_{RX}$, $S_{TXTX}$ and $S_{RXRX}$ and transmission coefficients $S_{TXRX}$ and $S_{RXTX}$ which may be effective at the TX port in the first state of the extension circuit 120.

In a second state, the extension circuit 120 can be configured to connect at least one of the RF ports $121_1$ to $121_n$ to the TX port and/or RX port. For example, the extension circuit 120 can be controlled (e.g., by the tester 100) to connect at least one of the RF ports $121_1$ to $121_n$ to the TX port and/or RX port via the switch matrix 125.

Figure 5B:
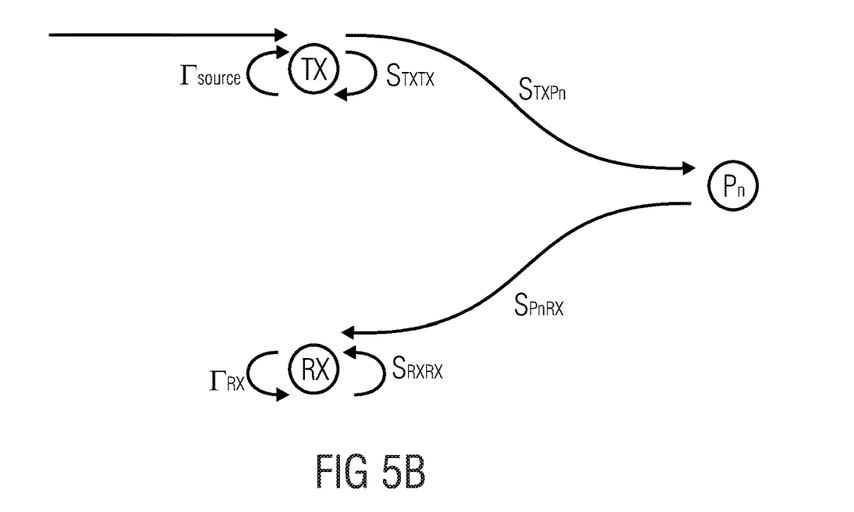
FIG. 5b shows an illustrative view of the reflection coefficients and transmission coefficients which may be effective at the TX port and the RX port in the second state of the extension circuit.

Note that FIG. 5b shows an illustrative view of the reflection coefficients $\Gamma_{source}$, $\Gamma_{RX}$, $S_{TXTX}$ and $S_{RXRX}$ and transmission coefficients $S_{TXPn}$ and $S_{PnRX}$ which may be effective at the TX port and the RX port in the second state of the extension circuit 120.

Further, the extension circuit 120 can compromise a switch 126 connected to the calibration device 122 and connected between the TX port and the switch matrix 125.

In the first state and in the second state, the extension circuit 120 can be configured to connect the TX port to the switch matrix 125, wherein in a third state the extension circuit 120 can be configured to connect the TX port to the calibration device 122.

Figure 5C:
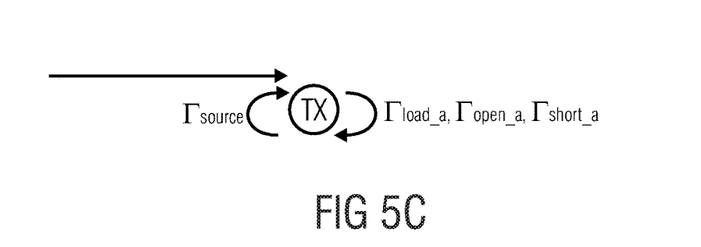
FIG. 5c shows an illustrative view of the reflection coefficients which may be effective at the TX port in the third state of the extension circuit.

Note that FIG. 5c shows an illustrative view of the reflection coefficients $\Gamma_{load\_a}$, $\Gamma_{short\_a}$, $\Gamma_{open\_a}$ and $\Gamma_{source}$ which may be effective at the TX port in the third state of the extension circuit 120.

In the following, a possible calibration procedure (e.g., performed by the tester 100) of the source power $P_{source}$ of the source and measuring device 102 and of the receiver power $P_{RX}$ of the receiver 104 is described.

In other words, in the following, an integrated high accuracy power calibration technique between two RF circuit parts 100 and 120 with the usage of their characteristic impedances and the determining of the unknown output match of an TX/RX system with circuit integrated hardware only is described ((apparatus for measuring linear and nonlinear port parameters) source and measuring device 102 in the (main circuit) tester 100 and calibration standards such as open, short, load in the (excluded circuit) extension circuit 120).

Eliminating the in the introductory part mentioned mismatch uncertainty needs a vector based compensation knowing the output match $\Gamma_{source}$ at the port TX and the input match $\Gamma_{load}$ of the extension circuit.

Solving equation (1) for a source power $P_{source}$ gives the power $P_{TX}$ at the port TX:

$$P_{TX} = P'_{source} \frac{1 - |\Gamma_{load\_a}|^2}{|1 - \Gamma_{load\_a}\Gamma_{source}|^2} \quad (1)$$

$$P'_{source} = P_{source} + calfactor \quad (1.1)$$

Thereby, $P_{TX}$ is the power at the port TX which is measured with the power sensor 124 of the extension circuit, $P'_{source}$ is the actual power of the source and measuring device 102 when the TX port is loaded with the power sensor 124 of the extension circuit 120, and calfactor is the power difference between $P'_{source}$ and $P_{source}$.

The input match $\Gamma_{load\_a}$ can be measured after assembly as a part of the fabrication calibration, which also includes the power sensor calibration and the S parameter measurement of all paths.

Unknown is the output match of the tester 100 transformed through the connection circuit 130 at the point where the extension circuit 120 is connected to (port TX). While calibrating the source and measuring device 102 of the tester 100, the forward source match ($\Gamma_{source}$) referenced to TX can be determined, too.

With three terminations (open, short, load (the power sensor 124)) the one port calibration at TX can be done.

All terminations are installed inside the extension circuit 120 routed via a switch to the TX port.

The actual reflection coefficient $\Gamma_{open\_a}$ of the open termination 135 in the extension circuit 120 referenced to the port TX is given by equation (2):

$$\Gamma_{open\_a} = \frac{\Gamma_{open\_m} - E_{df}}{\Gamma_{source}(\Gamma_{open\_m} - E_{df}) + E_{rf}} \quad (2)$$

The actual reflection coefficient $\Gamma_{short\_a}$ of the short termination 134 in the extension circuit 120 referenced to the port TX is given by equation (3):

$$\Gamma_{short_a} = \frac{\Gamma_{short\_m} - E_{df}}{\Gamma_{source}(\Gamma_{short\_m} - E_{df}) + E_{rf}} \quad (3)$$

The actual reflection coefficient $\Gamma_{load\_a}$ of the load termination 135 in the extension circuit 120 referenced to the port TX is given by equation (4):

$$\Gamma_{load_a} = \frac{\Gamma_{load\_m} - E_{df}}{\Gamma_{source}(\Gamma_{load\_m} - E_{df}) + E_{rf}} \quad (4)$$

Thereby, $E_{df}$ is the forward directivity of the source and measuring device 102, and $E_{rf}$ is the forward reflection tracking of the source and measuring device 102.

After measuring all three reflection coefficients $\Gamma_{open\_m}$, $\Gamma_{load\_m}$ and $\Gamma_{short\_m}$ a calculation yields all three terms for calibrating the source and measuring device, including the source match of the circuit $\Gamma_{source}$ at TX:

$$\Gamma_{source} = -\frac{\begin{array}{c}\Gamma_{short\_a}(\Gamma_{load\_m} - \Gamma_{open\_m}) + \Gamma_{open\_a}(\Gamma_{short\_m} - \Gamma_{load\_m}) - \\ \Gamma_{load\_a}(\Gamma_{short\_m} - \Gamma_{open\_m})\end{array}}{\begin{array}{c}\Gamma_{short\_a}\Gamma_{load\_a}(\Gamma_{short\_m} - \Gamma_{load\_m}) + \\ \Gamma_{load\_a}\Gamma_{open\_a}(\Gamma_{load\_m} - \Gamma_{open\_m}) + \\ \Gamma_{short\_a}\Gamma_{open\_a}(\Gamma_{open\_m} - \Gamma_{short\_m})\end{array}} \quad (5)$$

A power level $P_{source}$ is set and the power sensor 124 in the extension circuit 120 measures the power at the port TX. This value includes the calibration factor and the mismatch loss that appears when the path from port TX to the power sensor 124 is activated. The power $P_{TX}$ which is available at a perfect 50 Ohm load can be calculated with equation (1).

To set the absolute power $P_n$ at the port n (e.g., 50 Ohm terminated) equation (6) can be used:

$$P_n = P_{source}\frac{|S_{nTX}|^2}{|S_{TXTX}\Gamma_{source} - 1|^2} \quad (6)$$

This technique also can be used for the power calibration of the receiver 104 of the tester 100.

Thereby, the match of the receiver 104 can be measured with the source and measuring device 102 through the TX/RX path (also possible for the connection TX to the port n ($121_1$ to $121_n$)). Further, the power level $P_{source}$ ($P_{TX}$) can be set (this is already known). Further, the power at the port RX can be calculated with equation (7):

$$P_{RX} = P_{source} \frac{|S_{RXTX}|^2(1-|\Gamma_{RX}|^2)}{\left|\begin{array}{c} S_{TXTX}\Gamma_{source} + \\ \Gamma_{RX}(S_{RXRX} + \Gamma_{source}(S_{TXRX}S_{RXTX} - S_{TXTX}S_{RXRX})) - 1 \end{array}\right|^2} \quad (7)$$

$$P_{RX} = P_n \frac{|S_{RXn}|^2(1-|\Gamma_{RX}|^2)}{|S_{RXRX}\Gamma_{RX} - 1|^2} \quad (8)$$

$$\Gamma'_{RX} = S_{TXTX} + \frac{S_{TXRX}S_{RXTX}\Gamma_{RX}}{1 - S_{RXRX}\Gamma_{RX}} \quad (9)$$

This value can be compared to the measured power level, in order to calibrate the receiver 104.

Now, with the additional installed terminations inside the extension circuit 120 a highly accurate power level compensation is possible for all ports of the extension circuit 120 without using external equipment, such as a power sensor, source, calibration standards, etc.

This technique is timesaving, because the measurement for calibration is divided into two pieces.

First, all data which describes the extension circuit 120 is measured after assembly. Second, the rest of the data that is necessitated for power calibration is reduced to a minimum, without user interaction.

With the vector based in-system power calibration the absolute power level can be very accurate calibrated for stimulus and receiver.

Subsequently, the steps, e.g., performed by the tester 100 (or system 140), for calibrating the source power $P_{source}$ of the source and measuring device 102 and the receiver power $P_{RX}$ of the receiver 104 are enumerated.

1. Assembly of extension circuit 120.
2. Measure/calibration of extension circuit 120 (e.g., measuring S-parameters of all paths and reflection coefficients $\Gamma_{load\_a}$, $\Gamma_{short\_a}$, $\Gamma_{open\_a}$ of all terminations 124, 134, 135 with reference at TX and power sensor calibration referenced to TX.

As already mentioned above, unknown is the output match of the tester 100 transformed through the connection circuit 130 at the point where the extension circuit 120 is connected to (port TX). While calibrating the source and measuring device 102 of the tester 100, the forward source match $\Gamma_{source}$ referenced to TX can be determined, too.

With three terminations (open termination 135, short termination 134, load termination 124 (namely the matched power sensor 124) the one port calibration at TX can be done.

All terminations 124, 134, 135 are installed inside the extension circuit 120 routed via a switch 126 to the TX port.

3. Connect the extension circuit 120 via the connection circuit 130 to the tester 100 (final position in testhead).
4. Measure with the source and measuring device 102 $\Gamma_{load\_m}$, $\Gamma_{short\_m}$, $\Gamma_{open\_m}$ at port TX.
5. Use equation (5) to calculate $\Gamma_{source}$.

After measuring all three reflection coefficients $\Gamma_{open\_m}$, $\Gamma_{load\_m}$ and $\Gamma_{short\_m}$ a calculation yields all three terms for calibrating the source and measuring device, including the source match of the circuit $\Gamma_{source}$ at TX.

6. Set power $P_{source}$ (at this point uncalibrated).
7. Set path from TX to internal power sensor 124.
8. Measure power $P_{TX}$ at TX with power sensor 124 of extension circuit 120.
9. With equation (1) calculate true $P'_{source}$ (max power level at TX is known (this level is the maximum power at TX if TX is terminated with 50 Ohm and (almost) nothing is reflected from the port back to the source)).
10. Get calfactor $=P'_{source} - P_{source}$ (this factor is only the relation between the set power and the power, if TX is terminated with 50 Ohm).
11. Set path from TX to RX (loopback path) – this path is terminated with $\Gamma_{RX}$.
12. Measure with the source and measuring device 102 the input match $\Gamma'_{RX}$ of the port TX, terminated with $\Gamma_{RX}$.
13. Calculate $\Gamma_{RX}$ with equation (9).
14. Set $P_{source}$ ($P'_{source}$ –calfactor).
15. Calculate power $P_{RX}$ at RX with equation (7).
16. Measure power with sensor 106 on tester 100.
17. This measured value represents the power $P_{RX}$ at port RX→receiver is abs. calibrated at RX.
18. The receiver 104 has a(n) (almost) perfect linear behavior →guaranteed per design, therefore one point is sufficient.
19. All stimulus power levels can be measured with the calibrated receiver 104 through the loopback path of the extension circuit 120. →full stimulus calibration to the port TX.
20. To set an accurate power level to the port n (device under test, which has a 50 Ohm input impedance) a transformation from port TX to port n is necessitated, with equation (6).
21. To receive a signal a transformation from port n to port RX is necessitated with equation (8).

Figure 6:
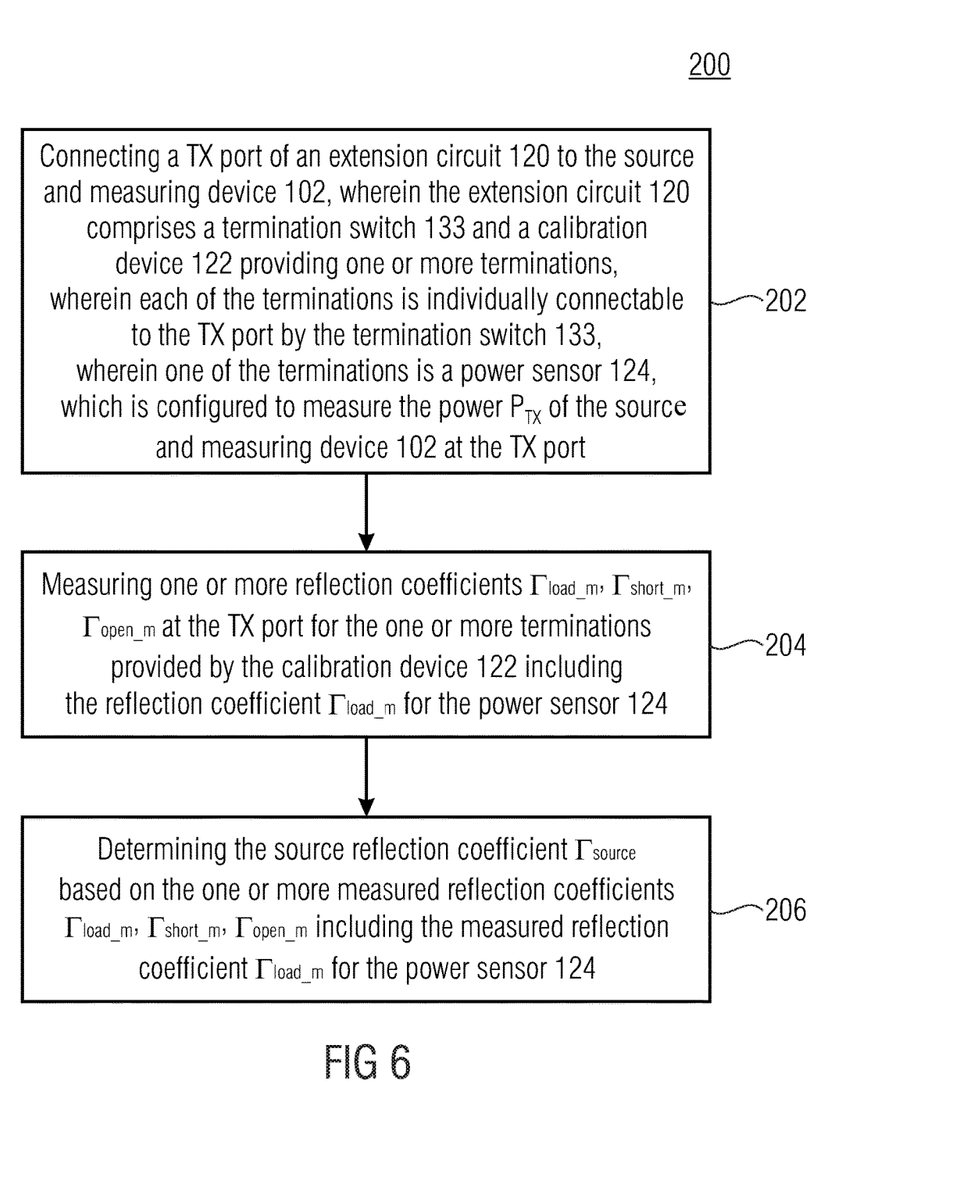
FIG. 6 shows a flow chart of a method for calibrating a source power of a source and measuring device of a tester, according to an embodiment of the present invention.

FIG. 6 shows a method 200 for determining the source reflection coefficient $\Gamma_{source}$ of a source and measuring device 102 of a tester 100. The method 200 comprises a step 202 of connecting a TX port of an extension circuit 120 to the source and measuring device 102, wherein the extension circuit 120 comprises a termination switch 133 and a calibration device 122 providing one or more terminations, wherein each of the terminations is individually connectable to the TX port by the termination switch 133, wherein one of the terminations is a power sensor 124, which is configured to measure the power $P_{TX}$ of the source and measuring device 102 at the TX port. Further, the method 200 comprises a step 204 of measuring one or more reflection coefficients $\Gamma_{load\_m}$, $\Gamma_{short\_m}$, $\Gamma_{open\_m}$ at the TX port for the one or more terminations provided by the calibration device 122 including the reflection coefficient $\Gamma_{load\_m}$ for the power sensor 124. Moreover, the method 200 comprises a step 206 of determining the source reflection coefficient $\Gamma_{source}$ based on the one or more measured reflection coefficients $\Gamma_{load\_m}$, $\Gamma_{short\_m}$, $\Gamma_{open\_m}$ including the measured reflection coefficient $\Gamma_{load\_m}$ for the power sensor 124.

Although some aspects have been described in the context of an apparatus, it is clear that these aspects also represent a description of the corresponding method, where a block or device corresponds to a method step or a feature of a method step. Analogously, aspects described in the context of a method step also represent a description of a corresponding block or item or feature of a corresponding apparatus. Some or all of the method steps may be executed by (or using) a hardware apparatus, like for example, a microprocessor, a programmable computer or an electronic circuit. In some embodiments, some one or more of the most important method steps may be executed by such an apparatus.

Depending on certain implementation requirements, embodiments of the invention can be implemented in hardware or in software. The implementation can be performed using a digital storage medium, for example a floppy disk, a DVD, a Blu-Ray, a CD, a ROM, a PROM, an EPROM, an EEPROM or a FLASH memory, having electronically readable control signals stored thereon, which cooperate (or are capable of cooperating) with a programmable computer system such that the respective method is performed. Therefore, the digital storage medium may be computer readable.

Some embodiments according to the invention comprise a data carrier having electronically readable control signals, which are capable of cooperating with a programmable computer system, such that one of the methods described herein is performed.

Generally, embodiments of the present invention can be implemented as a computer program product with a program code, the program code being operative for performing one of the methods when the computer program product runs on a computer. The program code may for example be stored on a machine readable carrier.

Other embodiments comprise the computer program for performing one of the methods described herein, stored on a machine readable carrier.

In other words, an embodiment of the inventive method is, therefore, a computer program having a program code for performing one of the methods described herein, when the computer program runs on a computer.

A further embodiment of the inventive methods is, therefore, a data carrier (or a digital storage medium, or a computer-readable medium) comprising, recorded thereon, the computer program for performing one of the methods described herein. The data carrier, the digital storage medium or the recorded medium are typically tangible and/or non-transitionary.

A further embodiment of the inventive method is, therefore, a data stream or a sequence of signals representing the computer program for performing one of the methods described herein. The data stream or the sequence of signals may for example be configured to be transferred via a data communication connection, for example via the Internet.

A further embodiment comprises a processing means, for example a computer, or a programmable logic device, configured to or adapted to perform one of the methods described herein.

A further embodiment comprises a computer having installed thereon the computer program for performing one of the methods described herein.

A further embodiment according to the invention comprises an apparatus or a system configured to transfer (for example, electronically or optically) a computer program for performing one of the methods described herein to a receiver. The receiver may, for example, be a computer, a mobile device, a memory device or the like. The apparatus or system may, for example, comprise a file server for transferring the computer program to the receiver.

In some embodiments, a programmable logic device (for example a field programmable gate array) may be used to perform some or all of the functionalities of the methods described herein. In some embodiments, a field programmable gate array may cooperate with a microprocessor in order to perform one of the methods described herein. Generally, the methods are performed by any hardware apparatus.

While this invention has been described in terms of several advantageous embodiments, there are alterations, permutations, and equivalents which fall within the scope of this invention. It should also be noted that there are many alternative ways of implementing the methods and compositions of the present invention. It is therefore intended that the following appended claims be interpreted as including all such alterations, permutations, and equivalents as fall within the true spirit and scope of the present invention.

IDENTIFIERS $P_{TX}$ power at the port TX, measured with the power sensor 124 of the extension circuit 120.

$P_{RX}$ power at the port RX, measured with the power sensor 106 of the receiver 104.

$P'_{source}$ actual power of the source and measuring device 102, when the TX port is loaded with the power sensor 124 of the extension circuit 120.

$P_{source}$ set power of the source and measuring device 102.

$\Gamma_{source}$ source match of the source and measuring device 102 referenced to the port TX.

$\Gamma_{RX}$ actual input math of the receiver 104 referenced to the port RX.

$\Gamma'_{RX}$ input match of the receiver 104 measured with the source and measuring device 102.

$P_n$ power at the port n (121$_1$ to 121$_n$) of the extension circuit 120.

$\Gamma_{load\_a}$ actual reflection coefficient of the load in the extension circuit 120 referenced to the port TX.

$\Gamma_{short\_a}$ actual reflection coefficient of the short in the extension circuit 120 referenced to the port TX.

$\Gamma_{open\_a}$ actual reflection coefficient of the open in the extension circuit 120 referenced to the port TX.

$\Gamma_{load\_m}$ measured reflection coefficient of the load in the extension circuit 120 referenced to the port TX with the source and measuring device 102.

$\Gamma_{short\_m}$ measured reflection coefficient of the short in the extension circuit 120 referenced to the port TX with the source and measuring device 102.

$\Gamma_{open\_m}$ measured reflection coefficient of the open in the extension circuit 120 referenced to the port TX with the source and measuring device 102.

$S_{TXTX}$ actual reflection coefficient of the TX port in the extension circuit 120 referenced to the port TX, when the path in the extension circuit 120 is set from the port TX to the port RX.

$S_{RXRX}$ actual reflection coefficient of the RX port in the extension circuit 120 referenced to the port RX, when the path in the extension circuit 120 is set from the port TX to the port RX.

$S_{TXRX}$ actual transmission coefficient of the path from the port RX to the port TX of the extension circuit 120.

$S_{RXTX}$ actual transmission coefficient of the path from the port TX to the port RX of the extension circuit 120.

$E_{df}$ forward directivity of the source and measuring device 102.

$E_{rf}$ forward reflection tracking of the source and measuring device 102.

calfactor power difference between $P'_{source}$ and $P_{source}$.

$S_{nTX}$ actual transmission coefficient of the path from the port TX to the port n (121$_1$ to 121$_n$) of the extension circuit 120.

$S_{RXn}$ actual transmission coefficient of the path from the port n (121$_1$ to 121$_n$) to the port RX of the extension circuit 120.

The invention claimed is:

1. An apparatus, comprising:
  a tester configured to connect to an extension circuit and comprising a source and measuring device,
    wherein the extension circuit comprises a TX (transmission) port connectable to the source and measuring device,
    wherein the source and measuring device is configured to measure one or more reflection coefficients at the TX port, and wherein the tester is configured to determine a source reflection coefficient of the source and measuring device by using the one or more measured reflection coefficients.

2. The apparatus according to claim 1, wherein the extension circuit further comprises a termination switch and a calibration device that provides one or more terminations, wherein each of the terminations is individually connectable to the TX port by the termination switch,
wherein the calibration device comprises a power sensor, wherein one of the terminations is the power sensor, which is configured to measure a power of the source and measuring device at the TX port,
wherein the one or more reflection coefficients at the TX port are related to the one or more terminations provided by the calibration device,
wherein one of the terminations is an open termination,
wherein the source and measuring device is configured to measure the reflection coefficient at the TX port for the open termination provided by the calibration device, and
wherein the tester is configured to determine the source reflection coefficient based on the measured reflection coefficient for the open termination.

3. The apparatus according to claim 1, wherein the extension circuit further comprises a termination switch and a calibration device that provides one or more terminations, wherein each of the terminations is individually connectable to the TX port by the termination switch,
wherein the calibration device comprises a power sensor, wherein one of the terminations is the power sensor, which is configured to measure a power of the source and measuring device at the TX port,
wherein the one or more reflection coefficients at the TX port are related to the one or more terminations provided by the calibration device,
wherein one of the terminations is a short termination,
wherein the source and measuring device is configured to measure the reflection coefficient at the TX port for the short termination provided by the calibration device, and
wherein the tester is configured to determine the source reflection coefficient based on the measured reflection coefficient for the short termination.

4. The apparatus according to claim 1, wherein the extension circuit further comprises a termination switch and a calibration device that provides one or more terminations, wherein each of the terminations is individually connectable to the TX port by the termination switch,
wherein the calibration device comprises a power sensor, wherein one of the terminations is the power sensor, which is configured to measure a power of the source and measuring device at the TX port,
wherein the one or more reflection coefficients at the TX port are related to the one or more terminations provided by the calibration device,
wherein the terminations exclusively comprise the power sensor, an open termination and a short termination,
wherein the source and measuring device is configured to measure the reflection coefficients at the TX port for the power sensor, for the open termination and for the short termination provided by the calibration device, and
wherein the tester is configured to determine the source reflection coefficient based on the measured reflection coefficients for the power sensor, for the open termination and for the short termination.

5. The apparatus according to claim 1, wherein the extension circuit further comprises a termination switch and a calibration device that provides one or more terminations, wherein each of the terminations is individually connectable to the TX port by the termination switch, and
wherein the termination switch is a SP3T switch.

6. The apparatus according to claim 1, wherein the extension circuit further comprises a termination switch and a calibration device that provides one or more terminations, wherein each of the terminations is individually connectable to the TX port by the termination switch,
wherein the calibration device comprises a power sensor, wherein one of the terminations is the power sensor, which is configured to measure a power of the source and measuring device at the TX port,
wherein the one or more reflection coefficients at the TX port are related to the one or more terminations provided by the calibration device,
wherein the source and measuring device includes a source power, and
wherein the tester is configured to calibrate the source power of the source and measuring device using the determined source reflection coefficient and the power sensor.

7. The apparatus according to claim 6, wherein the tester is configured to calibrate the source power of the source and measuring device by acquiring a measured source power at the TX port using the power sensor of the calibration device, and determining an actual source power available for a termination of the TX port with a reference impedance using the measured source power and the source reflection coefficient.

8. The apparatus according to claim 7, wherein the tester is configured to determine a calibration factor for calibrating the source power based on the set source power set at the source and measuring device and the actual source power.

9. The apparatus according to claim 6, wherein the tester further comprises a receiver, which is connectable to a RX (receiving) port of the extension circuit, wherein the tester is configured to set up a loopback path connecting the TX port and the RX port via the extension circuit, and wherein the tester is configured to calibrate a receiver power of the receiver using the calibrated source power and a power sensor of the receiver.

10. The apparatus according to claim 9, wherein the tester is configured to determine a reflection coefficient presented by a receiver path to the extension circuit at the RX port by using a measured reflection coefficient measured at the TX port with the source and measuring device under the condition that the TX port is connected with the RX port and that the RX port is connected to the receiver path, and known parameters of the extension circuit, and to calibrate the receiver power further based on the determined reflection coefficient presented by the receiver path to the extension circuit at the RX port.

11. The apparatus according to claim 10, wherein the tester is configured to calibrate the receiver power by using a calculated receiver power at the RX port that is calculated by using the determined reflection coefficient presented by the receiver path to the extension circuit at the RX port and known parameters of the extension circuit.

12. The apparatus according to claim 9, wherein the tester is configured to derive a power input to the extension circuit from a device under test on the basis of a power value measured by the receiver of the tester.

13. The apparatus according to claim 1, wherein the tester is configured to derive a power value at a port of the extension circuit using known parameters of the extension circuit,
wherein the extension circuit comprises a calibration device that comprises a power sensor,
wherein the one or more reflection coefficients comprise a reflection coefficient for the power sensor, and
wherein the one or more measured reflection coefficients comprise the measured reflection coefficient for the power sensor.

14. The apparatus according to claim 13, wherein the known parameters of the extension circuit comprise at least one of
reflection S parameters of the extension circuit; or
transmission S parameters of the extension circuit.

15. The apparatus according to claim 14, wherein the tester is configured to determine the source reflection coefficient further based on known reflection coefficients of the extension circuit at the TX port.

16. A system, comprising:
a tester comprising a source and measuring device; and
an extension circuit comprising a TX (transmission) port connected to the tester, a termination switch and a calibration device that provides one or more terminations, wherein each of the terminations is individually connectable to the TX port by the termination switch,
wherein the calibration device comprises a power sensor,
wherein one of the terminations is the power sensor, which is configured to measure a power of the source and measuring device at the TX port,
wherein the source and measuring device is configured to measure one or more reflection coefficients at the TX port for the one or more terminations provided by the calibration device, and
wherein the tester is configured to determine a source reflection coefficient of the source and measuring device by using the one or more measured reflection coefficients.

17. The system according to claim 16, wherein one of the terminations is an open termination,
wherein the source and measuring device is configured to measure the reflection coefficient at the TX port for the open termination provided by the calibration device, and
wherein the tester is configured to determine the source reflection coefficient based on the measured reflection coefficient for the open termination.

18. The system according to claim 16, wherein one of the terminations is a short termination,
wherein the source and measuring device is configured to measure the reflection coefficient at the TX port for the short termination provided by the calibration device, and
wherein the tester is configured to determine the source reflection coefficient based on the measured reflection coefficient for the short termination.

19. The system according to claim 16, wherein the terminations exclusively comprise the power sensor, an open termination and a short termination,
wherein the source and measuring device is configured to measure the reflection coefficients at the TX port for the power sensor, for the open termination and for the short termination provided by the calibration device, and
wherein the tester is configured to determine the source reflection coefficient based on the measured reflection coefficients for the power sensor, for the open termination and for the short termination.

20. The system according to claim 16, wherein the tester and the extension circuit are connected via a RX (receiving) port of the extension circuit, and wherein the extension circuit is configured to provide a loopback path by connecting the TX port and the RX port.

21. The system according to claim 16, wherein the extension circuit comprises at least one RF port configured to be connected to a device under test, and wherein the extension circuit is configured to connect the at least one RF port to the TX port and/or a RX (receiving) port of the extension circuit.

22. The system according to claim 16, wherein the tester and the extension circuit are connected via a RX (receiving) port of the extension circuit, wherein the extension circuit comprises a switch matrix connected between the TX port, the RX port and at least one RF port of the extension circuit, wherein the at least one RF port is configured to be connected to a device under test;
wherein in a first state the extension circuit is configured to provide a loopback path by connecting the TX port and the RX port; and
wherein in a second state the extension circuit is configured to connect the at least one RF port to the TX port and/or the RX port.

23. The system according to claim 22, wherein the extension circuit comprises a switch connected to the calibration device and connected between the TX port and the switch matrix;
wherein in the first state and the second state the extension circuit is configured to connect the TX port to the switch matrix; and
wherein in a third state the extension circuit is configured to connect the TX port to the calibration device.

24. The system according to claim 16, wherein the tester further comprises a connection circuit including flexible cables, wherein the tester is connected to the extension circuit via the flexible cables,
wherein the one or more reflection coefficients comprise a reflection coefficient for the power sensor, and
wherein the one or more measured reflection coefficients comprise the measured reflection coefficient for the power sensor.

25. A method of determining a source reflection coefficient, the method comprising:
connecting a TX (transmission) port of an extension circuit to a source and measuring device, wherein the extension circuit comprises a termination switch and a calibration device that provides one or more terminations, wherein each of the terminations is individually connectable to the TX port by the termination switch, wherein the calibration device comprises a power sensor, wherein one of the terminations is the power sensor, which is configured to measure a power of the source and measuring device at the TX port;
measuring one or more reflection coefficients at the TX port for the one or more terminations provided by the calibration device; and
determining the source reflection coefficient of the source and measuring device based on the one or more measured reflection coefficients.

26. The method according to claim 25, wherein the method further comprises: determining reflection S parameters and transmission S parameters of the extension circuit with a network analyzer before connecting the TX port of the extension circuit to the source and measuring device of a tester to acquire known parameters of the extension circuit,
  wherein the one or more reflection coefficients comprise a reflection coefficient for the power sensor, and
  wherein the one or more measured reflection coefficients comprise the measured reflection coefficient for the power sensor.

* * * * *